United States Patent [19]

Knepper et al.

[11] Patent Number: 4,462,091
[45] Date of Patent: Jul. 24, 1984

[54] WORD GROUP REDUNDANCY SCHEME

[75] Inventors: Ronald W. Knepper, Lagrangeville; Peter J. Ludlow, Hopewell Junction; Joseph A. Petrosky, Jr., Lagrangeville, all of N.Y.

[73] Assignee: International Business Machines Corporation, Armonk, N.Y.

[21] Appl. No.: 352,916

[22] Filed: Feb. 26, 1982

[51] Int. Cl.³ ............................................. G11C 11/40
[52] U.S. Cl. ................................................... 365/200
[58] Field of Search ...................... 365/200, 201, 210; 371/10

[56] References Cited

U.S. PATENT DOCUMENTS 4,346,459 8/1982 Sud et al. ............................. 365/200

OTHER PUBLICATIONS

Chan et al., "Array Word Redundancy Scheme", IBM Technical Disclosure Bulletin, vol. 25, No. 3A, Aug. 1982, pp. 989-992.
Beausoleil, "Utilization of Defective Memory Chips by Substituting Redundant Words for Defective Words", IBM Tech. Disc. Bull., vol. 15, No. 6, Nov. 1972, pp. 1864-1865.

Primary Examiner—Joseph A. Popek
Attorney, Agent, or Firm—Mitchell S. Bigel; Douglas A. Lashmit

[57] ABSTRACT

A word redundancy scheme for a high speed RAM where the bit output stage uses on-chip logic. An extra emitter on each of the decoders is utilized including redundant word group decoders. A compare circuit has an output to each of the extra emitters and when the address of a bad bit arrives at the compare circuit it de-selects each of the non-redundant decoders at that address and selects the redundant decoders via the extra emitters. Hence, the redundant decoders replace the decoders of the bad bit position.

7 Claims, 2 Drawing Figures

WORD GROUP REDUNDANCY SCHEME

BACKGROUND OF THE INVENTION

1. Field of the Invention

This invention relates to high speed random access memories and particularly to a system where the bit line output stage uses on-chip logic.

2. Description of the Prior Art

Various techniques have been proposed in the prior art to utilize memories with less than so-called "all good" memory elements. Auxiliary or redundant elements have been proposed to replace unusable ones once the bad element has been identified. The production of large storage devices having a large number of storage elements will not produce acceptable yields if it is necessary to exclude from use arrays having unusable individual storage elements. Accordingly, to achieve economic production less than perfect memories are deemed acceptable and the faulty storage element has either been replaced or eliminated so that the matrix itself may be operable despite the presence of individually defective storage elements.

Hence, the internal source of bit errors, defective individual elements, may be corrected by using redundant elements. This technique is distinguishable from approaches where the external symptoms of a memory error are treated by the use of error correcting code logic without attempting to consider the source of the error. Within the prior art, a variety of techniques have been proposed to correct memory errors either by the use of redundant hardware, by correction of the error itself, or a combination of the two approaches.

Typical is U.S. Pat. No. 3,898,443 which relates to error correction in a memory system utilizing additional logic and control circuitry built with individual IC components. Upon the detection of a memory output error, the incorrect bit is automatically identified and the output from the memory column which provided the error bit is inhibited. A spare memory column is activated and the information, initially in the error column, is transferred to the activated spare column. Consequently, the redundancy taught in the -443 patent is bit column redundancy which relies on the use of parity checking, an address register to hold the failed bit column address, a multiplexer to write the redundant column, decoders to inhibit the failed column and feedthrough of the redundant column together with complicated error control circuitry used along with a special test algorithm to identify the failed bit column. This prior art is not directed toward on-chip redundancy and is not applicable to a system where the array chip employs considerable logic functions performed with bit slice outputs.

U.S. Pat. No. 3,860,831 relates to a logic circuit having a redundant element in which an associative memory element is provided to electrically connect a redundant element with a logic circuit. Hence, a failed logic circuit is replaced by a redundant logic circuit using a bistable element to program the path. U.S. Pat. No. 3,665,173 relates to a different technique of stand-by redundancy including three active logic modules and at least one spare module. The system locates the failure of one of the active logic modules and reconfigures the system to bypass the faulty module and substitute a spare therefor. It however, does not relate to arrays of bi-polar devices having implemented systems functioning on-chip to improve overall system performance.

Prior art techniques directed toward using redundancy concepts to detect an error are shown for example in U.S. Pat. No. 3,585,377. This patent discloses the use of a decoder having layers of alternate failure mode logic circuits so that the failure of any individual logic element will always produce an error signal if the failure would cause an output error. IBM Technical Disclosure Bulletin Volume 23, No. 1, Page 213 (June, 1980), discloses a technique which utilizes a decoder circuit for switching off a defective bit and replacing it with a redundant bit provided for that purpose. While theoretically practicable, this approach does not find application to highly functional chips, that is, where a significant number of primary bits are gated onto a small bus before being outputted. The approach cannot be utilized where performance is the primary goal due to the series gating and the load placed on the redundant bit. A different technique of utilizing a separate sense amplifier for redundant word lines and selectively utilizing data read from the redundant word line is disclosed in IBM Technical Disclosure Bulletin, Volume 19, No. 5, Page 1638, (October, 1976). The system requires dual output circuits as well as word decode and compare logic. As such, it does not find application to highly functional chip arrays since it requires a multiplicity of circuits to completely develop the potential in word line redundancy.

An alternative technique for detecting an error by means of creating a redundant function and then comparing for duplicate states utilizing duplicated address decoders is shown in U.S. Pat. No. 4,165,533. A system for achieving on-chip redundancy for an FET chip is shown in IBM Technical Disclosure Bulletin, Volume 14, No. 5, Page 1513 (October, 1971). The system therein employs additional reset lines and decoders for the replacement of a failed word or bit line with a given address by utilizing another word or bit line but still retaining the same address. The setting of the addresses of the bad word lines and/or bad bit lines occurs in latches built on the chip, and therefore requires a latch for each normal decoder and a set of latches for each redundant decoder.

Accordingly, the prior art teaches a variety of techniques for achieving redundancy both on-chip and by ancillary off-chip hardware. A crucial short-coming in the prior art is the failure of any technique for implementing redundancy in the word dimension for a high speed random access memory (RAM) and particularly a memory arrangement where the bit line output stage utilizes on-chip logic making bit redundancy even more difficult to implement. Added on-chip functions are used in advanced bipolar array chips to achieve significant performance gains. Typical is implementation of logic to, for example, select bit slice outputs (a one out of four selection) thereby making conventional bit slice redundancy techniques exceptionally impractical.

It is therefore an object of this invention to define a redundancy scheme for highly functional random access memories.

Another object of this invention is to provide an on-chip redundancy scheme for bipolar memories where the bit-line output stage uses on-chip logic.

Still another object of this invention is to provide a redundancy scheme for high speed random access memories that does not impact on system performance yet improves yield rates by allowing the use of memories having defective components.

A further object of this invention is to provide an on-chip redundancy scheme with minimum component requirements so that chip area criteria are also minimized.

SUMMARY OF INVENTION

In order to overcome the problems of implementing redundancy on high performance bipolar arrays, the present invention achieves word group redundancy by adding a redundant address compare logic circuit, a redundant word group, and an extra emitter to each word decoder already on the chip. The compare circuit has an output to each of the extra emitters so that when the address of a bad bit arrives at the compare circuit, it deselects each of the non-redundant decoders and selects the redundant decoders via the extra emitters provided thereon. As a result, the redundant decoders on-chip replace the decoders at the defective bit location. Consequently, complete on-chip redundancy is accomplished.

The present invention will be described in greater detail by reference to the drawing and the disclosure of the preferred embodiment which follows.

DESCRIPTION OF THE PREFERRED EMBODIMENTS

Figure 1:
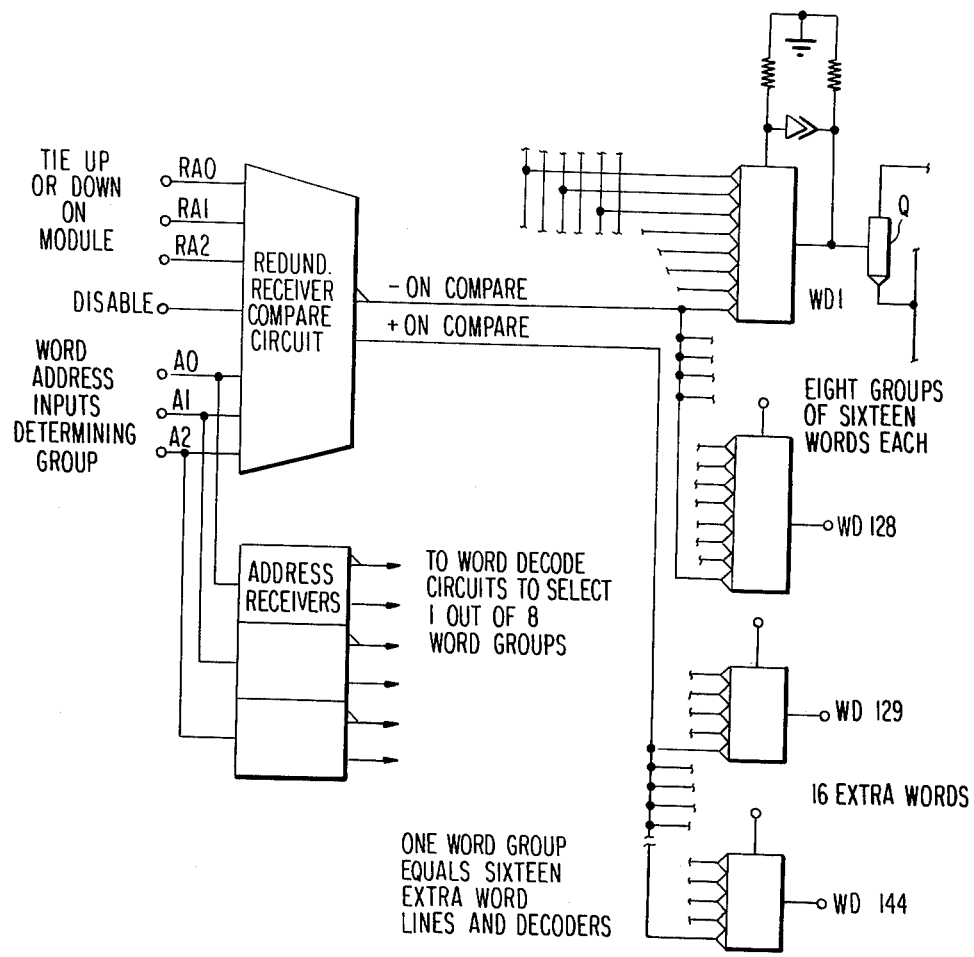
FIG. 1 is a schematic diagram showing a first embodiment of this invention having redundant word addresses personalized on the chip module.

Referring now to FIG. 1, a first embodiment of this invention is shown. The present invention proceeds by modifying existing on-chip hardware which includes, in a typical array forming a high speed RAM, a non-redundant memory with associated array/word decoders. The non-redundant portion is divided into eight groups of 16 words each. The word decoders (WD) are shown schematically as WD1-WD128. As is appreciated, the TTL decoder input stage shown in FIG. 1 has seven emitters for address access to form the 128 word line array. The input stage of the decoder is shown in schematic form, it being understood that a conventional TTL decoder having seven emitters is modified in accordance with the present invention. The input stage of the decoder is used to access its associated memory cells, conventionally bipolar circuits. The decoder applies "set" and "reset" signals to the base of transister Q, a bipolar device that switches select current to the memory cells. While a TTL decoder is shown, it is understood that a multi-level decoder or a current switch decoder may also be used. Such devices are well known in the art.

In accordance with the present invention, the 128 non-redundant word decoders (WD1-WD128) are modified to have an extra emitter input. This extra emitter input is coupled to the output of a redundant address receiver compare circuit as shown in FIG. 1.

The present invention also departs from conventional bipolar arrays by having a redundant portion disposed on-chip comprising 16 extra words WD129-WD144. Since the non-redundant portion is divided into eight groups of 16 words each, the additional 16 redundant words are equivalent to the addition of one additional word group. The 16 redundant word decoders WD129-WD144 require only 5 emitter inputs and the extra emitter inputs of those 16 redundant decoders are also coupled to the output of the redundant address receiver compare circuit.

FIG. 1 shows a first embodiment of the invention with the redundant receiver compare circuit receiving three word address inputs. These inputs are used for selecting the memory word group (one out of eight) to be accessed and are used by the compare circuit together with three redundant address inputs. The word address inputs are denoted in FIG. 1 as A0-A2 and the redundant address inputs are denoted as RA0-RA2.

The three redundant address inputs are personalized on the module to correspond to a particular word group having one or more defective bits which are determined by initial testing of the chip. The defect may be either bad cells or word lines. In accordance with the present invention, if the word address inputs A0-A2 correspond to the redundant address inputs RA0-RA2, the redundant receiver compare circuit provides an output as an up level true output and a down level complement output. This output causes the redundant word group WD129-WD144 to be selected in place of the known defective word group. The additional addresses then select one out of the 16 word lines in the redundant word group.

If the addresses A0-A2 do not correspond to RA0-RA2, then an operative portion is accessed. The compare circuit produces a down level on the true output and an up level on the complement output. Consequently, the redundant word group is deselected allowing a normal word group (WD1-WD128) to be selected.

As shown in FIG. 1, the compare circuit has a disable input. With the disable input at a down level, the redundant address receiver will always replace one of the eight word groups by the redundant word group. Consequently, a defect in the redundant word group or its circuitry would cause the entire chip to be defective. This, however, will not impact the overall use, since with the disable input rendered active the compare circuit can be forced into the non-compare state, disabling the redundant word group and correspondingly enabling the other word groups. The chip can therefore be configured to function in the "all good" mode.

As is apparent from the embodiment of FIG. 1, the compare circuitry introduced to the chip can be implemented as a standard address-receiver decoder driver with compare logic input circuitry. The introduction of an extra emitter input to the TTL word decoders does not substantially impact chip space utilization. Moreover, the bit circuitry itself is undisturbed by the redundancy introduced in accordance with the present invention. As a result, the implementation of the redundancy scheme shown in FIG. 1 has minimum impact on the chip in terms of density, chip function, power, performance, and input-output functions.

In accordance with the embodiment of FIG. 1, the module itself is personalized either by the use of a permanent wire or by an engineering change wire during manufacture. Personalization can be made according to the defective word group.

Figure 2:
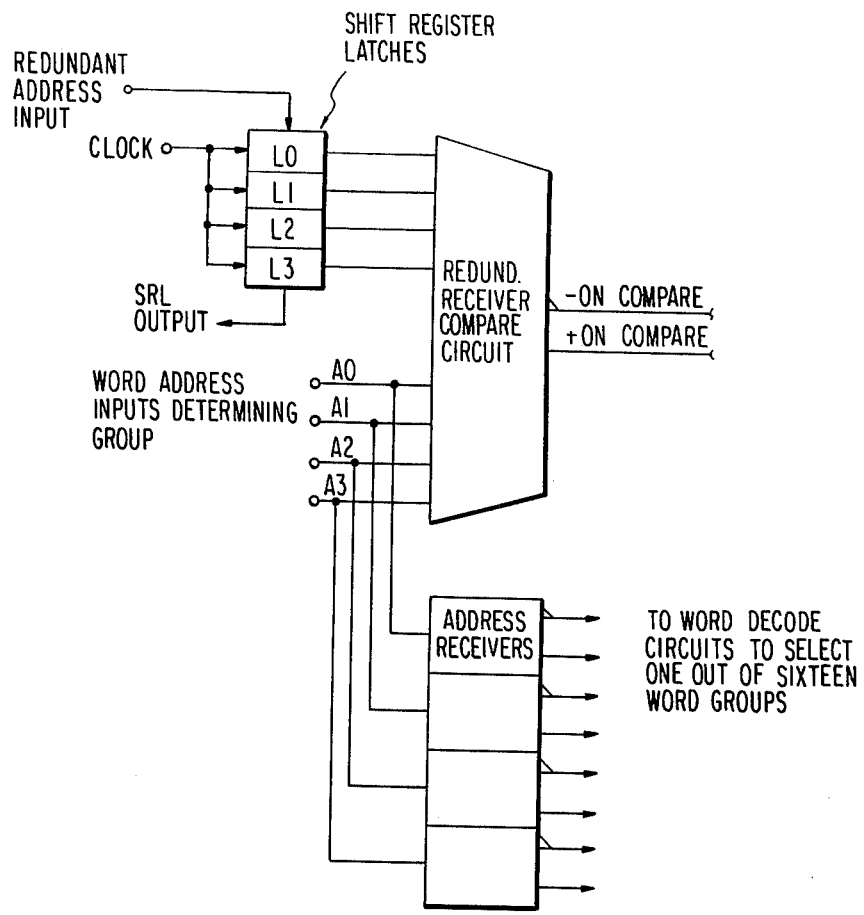
FIG. 2 is a second embodiment of this invention showing word group redundancy having redundant word addresses stored into shift register latch circuits upon the initiation of power to the RAM.

Referring now to FIG. 2, a second preferred embodiment of this invention is shown. FIG. 2 does not include the decoder section, it being understood that the non-redundant section will comprise 128 words. However, in FIG. 2, the redundancy organization is different in the sense that the normal word lines are arranged as 16 groups of 8 words each as opposed to 8 groups of 16 words. A redundant word group therefore contains 8 additional word lines and decoders such that the present redundant word group requires less chip area.

In FIG. 2, the redundant word group addresses are clocked into the shift register latches L0–L3 sequentially at the redundant address input synchronized with the clock input to each of the latches. The FIG. 2 embodiment allows the compare to be done on more addresses but still requires only two or three additional input-output lines for implementing redundancy. Accordingly, the FIG. 2 embodiment offers an organization having fewer redundant word lines in the redundant word group (8 as opposed to 16) and allows redundancy with less chip space required. This embodiment does not require the extra redundant address inputs of the FIG. 1 embodiment. However, as a design tradeoff the addresses of the failed word groups must be loaded into the latches at each system power-up.

It is apparent therefore that in accordance with the present invention a word redundancy scheme for a high speed RAM is defined requiring minimal changes to the circuitry that have a minimal impact on normal chip performance. The introduction of an extra emitter for each of the word group decoders does not affect overall chip density and the introduction of a compare circuit on-chip does not significantly influence chip power or I/O requirements. Importantly, chip function and performance are maintained so that overall system throughput is not degraded.

It is apparent that modifications of this invention may be achieved without departing from the essential scope thereof. In the context of address word redundancy in memory applications, it is apparent that bit redundancy may also be implemented. The invention is not limited to memory applications. For example, while this invention has been applied for redundancy in memory it finds utilization in applications to select and interchange any redundant function such as large redundant logic arrays.

We claim:

1. A word redundancy scheme for a random access memory arrangement wherein the bit output stage uses on-chip logic, comprising:

an array of word group decoders for a non-redundant portion of said memory and an array including at least one word group decoder for a redundant portion of said memory, each having an additional emitter;

a compare circuit having input means and output means;

means coupled to said compare circuit input means for applying a first set of address inputs representing word decoder locations in said non-redundant portion to be accessed, and a second set of address inputs representing defective bit address locations in said non-redundant memory portion; and means coupling said compare circuit output means to each of said additional emitters wherein when said first and said second sets of address inputs coincide, said decoders for a non-redundant portion are deselected and said decoders for said redundant portion are selected.

2. The redundancy scheme of claim 1 wherein said first set of address inputs are received from address receivers and said second set of address inputs are personalized signals for the chip.

3. The redundancy scheme of claim 2 wherein said non-redundant memory portion comprises eight groups of sixteen words each and said redundant memory portion comprises sixteen words, and wherein when said plurality of word decoders are deselected in a group said redundant memory portion replaces one groups of words.

4. The redundancy scheme of claim 1 further comprising a disable input to said compare circuit wherein when said disable input is active said compare circuit is rendered to a non-compare state to disable said redundant memory portion and enalbe said non-redundant memory portion.

5. The redundancy scheme of claim 1 wherein said first set of address inputs are received from chip inputs and said second set of address inputs are programmed into shift register latches.

6. The redundancy scheme of claim 5 wherein said non-redundant memory portion comprises sixteen groups of eight words each and said redundant memory comprises at least one group of eight words.

7. The redundancy scheme of claims 2, 4 or 5 wherein said non-redundant memory portion, said redundant memory portion, and said compare circuit are disposed on-chip.

* * * * *